(12) United States Patent
Cheng et al.

(10) Patent No.: US 12,550,708 B2
(45) Date of Patent: Feb. 10, 2026

(54) TOP VIA INTERCONNECT WITH AN EMBEDDED ANTIFUSE

(71) Applicant: INTERNATIONAL BUSINESS MACHINES CORPORATION, Armonk, NY (US)

(72) Inventors: Kenneth Chun Kuen Cheng, Shatin (HK); Koichi Motoyama, Clifton Park, NY (US); Chanro Park, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 842 days.

(21) Appl. No.: 17/651,820

(22) Filed: Feb. 21, 2022

(65) Prior Publication Data
US 2023/0268267 A1 Aug. 24, 2023

(51) Int. Cl.
*H01L 23/522* (2006.01)
*H01L 23/525* (2006.01)
*H01L 23/528* (2006.01)

(52) U.S. Cl.
CPC ...... *H01L 23/5226* (2013.01); *H01L 23/5252* (2013.01); *H01L 23/5283* (2013.01)

(58) Field of Classification Search
CPC ............. H01L 23/5226; H01L 23/5252; H01L 23/5283
See application file for complete search history.

(56) References Cited

U.S. PATENT DOCUMENTS

| | | | |
|---|---|---|---|
| 4,536,951 A | 8/1985 | Rhodes | |
| 5,693,568 A | 12/1997 | Liu | |
| 6,124,194 A | 9/2000 | Shao | |
| 6,251,710 B1 | 6/2001 | Radens | |
| 6,444,565 B1 | 9/2002 | Feild | |
| 7,572,682 B2 | 8/2009 | Yang | |
| 7,714,326 B2* | 5/2010 | Kim | H10B 20/00 257/50 |
| 7,927,995 B2 | 4/2011 | Yang | |
| 8,471,356 B2 | 6/2013 | Cheng | |
| 8,709,880 B2 | 4/2014 | Or-Bach | |
| 9,105,637 B2 | 8/2015 | Filippi | |
| 9,613,861 B2 | 4/2017 | Anderson | |
| 11,171,051 B1* | 11/2021 | Fullam | H01L 21/76877 |
| 2002/0155693 A1 | 10/2002 | Hong | |

(Continued)

OTHER PUBLICATIONS

Yang et al., Metal-to-metal antifuse with low programming voltage and low on-state resistance, Journal of Semiconductors, vol. 37, No. 7, Jul. 2016, pp. 074008-1-074008-4, Aug. 6, 2025.

*Primary Examiner* — Dale E Page
*Assistant Examiner* — Cristian A Tivarus
(74) *Attorney, Agent, or Firm* — L. Jeffrey Kelly

(57) ABSTRACT

An antifuse structure including a first metal line, a top via above and directly contacting the first metal line, a second metal line, and a conductive etch stop layer separating both the first metal line and the second metal line from an underlying layer, where a first portion of the conductive etch stop layer directly beneath the first metal line comprises a first extension region and a second portion of the conductive etch stop layer directly beneath the second metal line comprises a second extension region opposite the first extension region.

17 Claims, 14 Drawing Sheets

SECTION A-A

(56) References Cited

U.S. PATENT DOCUMENTS

| | | | |
|---|---|---|---|
| 2007/0205485 A1* | 9/2007 | Hsu | H10B 20/20 |
| | | | 257/E27.071 |
| 2012/0314475 A1* | 12/2012 | Li | H10B 20/25 |
| | | | 365/104 |
| 2012/0327700 A1* | 12/2012 | Li | H10D 89/911 |
| | | | 365/104 |
| 2013/0299940 A1 | 11/2013 | Kurz | |
| 2015/0056800 A1 | 2/2015 | Mebarki | |
| 2015/0214149 A1* | 7/2015 | Moy | H01L 23/5256 |
| | | | 438/467 |
| 2019/0103375 A1* | 4/2019 | Huang | H01L 24/19 |

* cited by examiner

SECTION A-A

SECTION B-B

SECTION C-C

SECTION A-A

SECTION B-B

SECTION C-C

SECTION A-A

SECTION B-B

SECTION C-C

SECTION A-A

SECTION B-B

SECTION C-C

SECTION A-A

SECTION B-B

SECTION C-C

SECTION A-A

SECTION B-B

SECTION C-C

SECTION A-A

SECTION B-B

TOP VIA INTERCONNECT WITH AN EMBEDDED ANTIFUSE

BACKGROUND

The present invention generally relates to semiconductor structures, and more particularly to back end of line interconnect structures with an embedded antifuse.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact formation. Layers of interconnections are formed above these logical and functional layers during the BEOL processing to complete the integrated circuit structure. As such, BEOL processing generally involves the formation of insulators and conductive wiring. The industry has typically used copper as the conductive metal for the interconnect structures most often using a dual damascene process to form a metal line/via interconnect structure.

A fuse is a structure that is normally "on" meaning that current is flowing, but once "programmed" it is "off" meaning that current does not flow. In a fuse, programming means applying a suitable voltage so that the fuse "blows" to create an open circuit or high resistance state. An antifuse is a structure that is normally "off" meaning that no current flows, but once "programmed" it is "on" meaning that current does flow. In an antifuse, programming means applying a suitable voltage to two electrodes and forming a conductive link between them to close the circuit.

In integrated circuitry memory devices, fuses and antifuses can be used for activating redundancy in memory chips and for programming functions and codes in logic chips. Specifically, dynamic random access memory (DRAM) and static random access memory (SRAM) may use fuses and antifuses for such purposes. In addition, fuses and antifuses can also be used to prevent decreased chip yield caused by random defects generated in the manufacturing process. Moreover, fuses and anti-fuses provide for future customization of a standardized chip design. For example, fuses and anti-fuses may provide for a variety of voltage options, packaging pin out options, or any other options desired by the manufacturer to be employed prior to the final processing. These customization possibilities make it easier to use one basic design for several different end products and help increase chip yield.

SUMMARY

According to an embodiment of the present invention, an antifuse structure is provided. The antifuse structure may include a first metal line, a top via above and directly contacting the first metal line, a second metal line, and a conductive etch stop layer separating both the first metal line and the second metal line from an underlying layer, where a first portion of the conductive etch stop layer directly beneath the first metal line comprises a first extension region and a second portion of the conductive etch stop layer directly beneath the second metal line comprises a second extension region opposite the first extension region.

According to another embodiment of the present invention, an antifuse structure is provided. The antifuse structure may include a first metal line, a top via above and directly contacting the first metal line, where the first metal line and the top via consist of a homogenous conductive material, a second metal line, and a conductive etch stop layer separating both the first metal line and the second metal line from an underlying layer, where a first portion of the conductive etch stop layer directly beneath the first metal line comprises a first extension region and a second portion of the conductive etch stop layer directly beneath the second metal line comprises a second extension region opposite the first extension region.

According to another embodiment of the present invention, an antifuse structure is provided. The antifuse structure may include a first conductive etch stop layer comprising a first extension region, a first metal line on top of and completely covering all of the first etch stop layer except for the first extension region, a top via above and directly contacting the first metal line, a second conductive etch stop layer comprising a second extension region aligned with the first extension region, and a second metal line on top of and completely covering all of the second etch stop layer except for the second extension region.

BRIEF DESCRIPTION OF THE DRAWINGS

The following detailed description, given by way of example and not intended to limit the invention solely thereto, will best be appreciated in conjunction with the accompanying drawings, in which.

Figure 1:
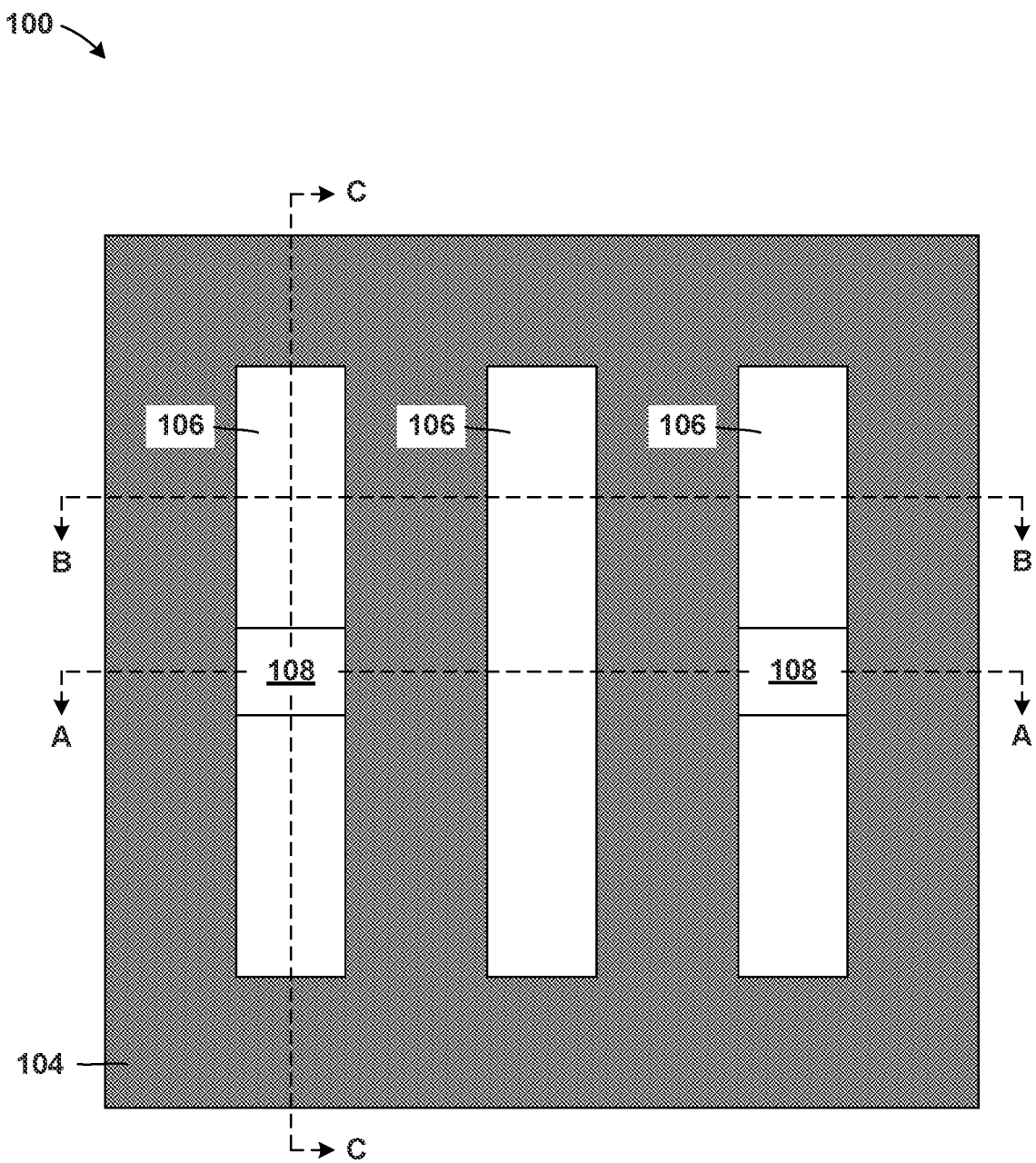
FIGS. 1, 2, 3, and 4, illustrates various views of the semiconductor structure during an intermediate step of a method of fabricating an interconnect structure according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Antifuses become difficult to fabricate when interconnect dimensions scales down. Some antifuses can be fabricated by placing metal islands between metal wires. Such antifuse features are difficult to fabricate as the spacing between the metal wires becomes sub-15 nm. Additionally, antifuses are typically relatively bulky and take up a valuable space in an integrated circuit design. Further, bulky antifuse structures reduce the amount of available space for more important interconnect structures, for example, metal wires, and other circuit components in the circuit.

The present invention generally relates to semiconductor structures, and more particularly to back end of line interconnect structures with an embedded antifuse. More specifically, the antifuse structures disclosed herein are embedded below and between two adjacent metal wires and/or top vias. Exemplary embodiments of embedded antifuse structures are described in detail below by referring to the accompanying drawings in FIGS. 1 to 27. Those skilled in the art will readily appreciate that the detailed description given herein with respect to these figures is for explanatory purposes as the invention extends beyond these limited embodiments.

Figure 2:
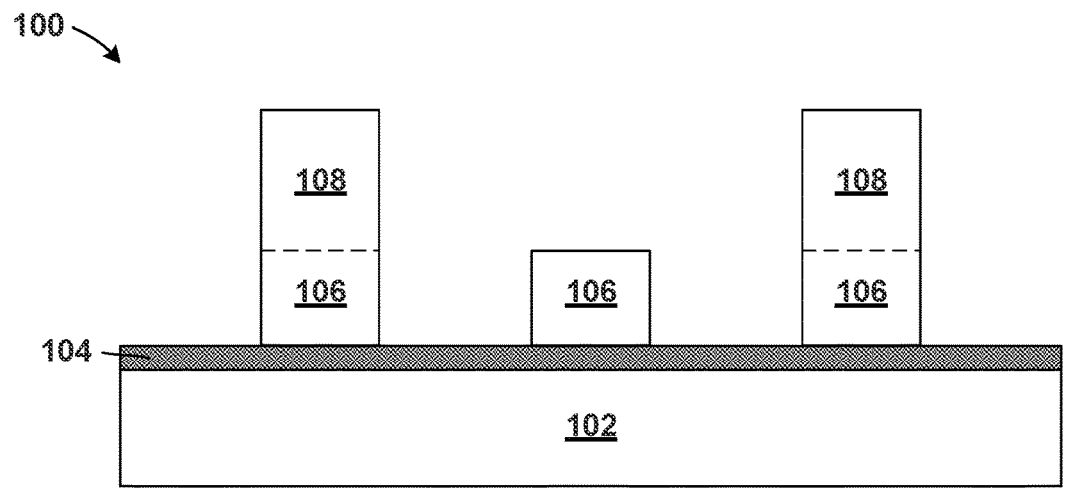
Figure 3:
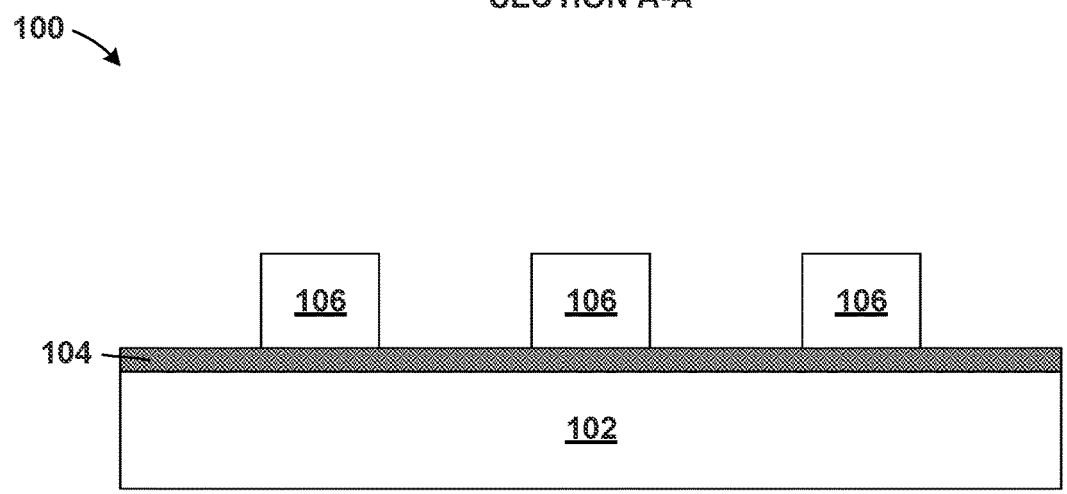
Figure 4:
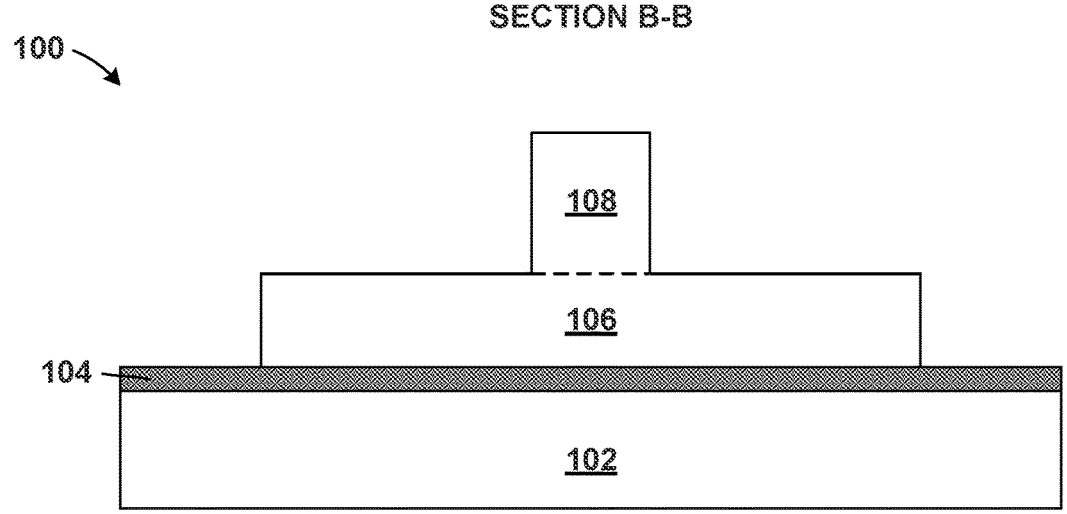

Referring now to FIGS. 1, 2, 3, and 4, a demonstrative illustration of a structure 100 is shown during an intermediate step of a method of fabricating an interconnect structure according to an embodiment of the invention. More specifically, as disclosed herein, the method may begin with forming an underlying level 102 followed by formation of an etch stop layer 104, metal lines 106 and top vias 108. FIG. 1 illustrates a top view of the structure 100, FIG. 2 illustrates a cross-section view of the structure 100 along section line A-A, FIG. 3 illustrates a cross-section view of the structure 100 along section line B-B, and FIG. 4 illustrates a cross-section view of the structure 100 along section line C-C.

The underlying level 102 represents any one of a front-end-of-line device layer, a middle-of-line metal layer, or a back-end-of-line metal layer. For example, the underlying level 102 may include multiple conductors (not shown) in an interlevel dielectric layer, as is well known and understood by persons killed in the art.

The etch stop layer 104 is blanket deposited on top of the underlying level 102. The etch stop layer 104 can include any known etch stop material. In the present embodiment, the etch stop layer 104 must be conductive. As such, the etch stop layer 104 used for embodiments of the present invention may include conductive or metallic materials which may also provide a suitable etch stop function. For example, the etch stop layer 104 may be made from titanium nitride (TiN). In an embodiment, the thickness of the etch stop layer 104 can range from approximately 1 nm to approximately 10 nm; however, other thicknesses greater than 10 nm are explicitly contemplated.

Next, the metal lines 106 and the top vias 108 are formed according to known techniques.

In contrast to typical dual damascene techniques, the metal lines 106 and the top vias 108 are subtractively formed. Further, because the top vias 108 are subtractively formed from a solid conductive material, the metal lines 106 and the top vias 108 consist of a homogenous conductive material without any barrier, liner, separation, or other interface. It is noted, the dashed line is provided in the figures for illustrative purposes only and to aid in the description of the embodiments presented herein.

The conductive interconnect material forming the metal lines 106 and the top vias 108 may include any metals which may be easily dry etched, such as, for example, cobalt, ruthenium, aluminum, tungsten or other platinum group metals. As is typical of most semiconductor interconnect structures, like the metal lines 106 and the top vias 108, one or more liners or barrier layers (note shown) may be first deposited within openings prior to depositing the primary conductive material. Typically, liners may include, for example, tantalum nitride (TaN), followed by an additional layer including tantalum (Ta). Alternatively, liners may include cobalt (Co) or ruthenium (Ru) either alone or in combination with any other suitable liner.

As such, the metal lines 106 may generally have common line dimensions and common line spacing. In an embodiment, for example, the width or critical dimension of the metal lines 106 can range from approximately 10 nm to approximately 15 nm; however, other width lesser than 10 nm and greater than 15 nm are explicitly contemplated. Additionally, according to at least an embodiment, the metal lines 106 are spaced with a common line pitch, such as, for example, approximately 30 nm.

It is further noted, although the top vias 108 are illustrated with a square cross-section in some views, they may have any cross-sectional shape including, but not limited to square, rectangle, circle, ellipse.

Figure 5:
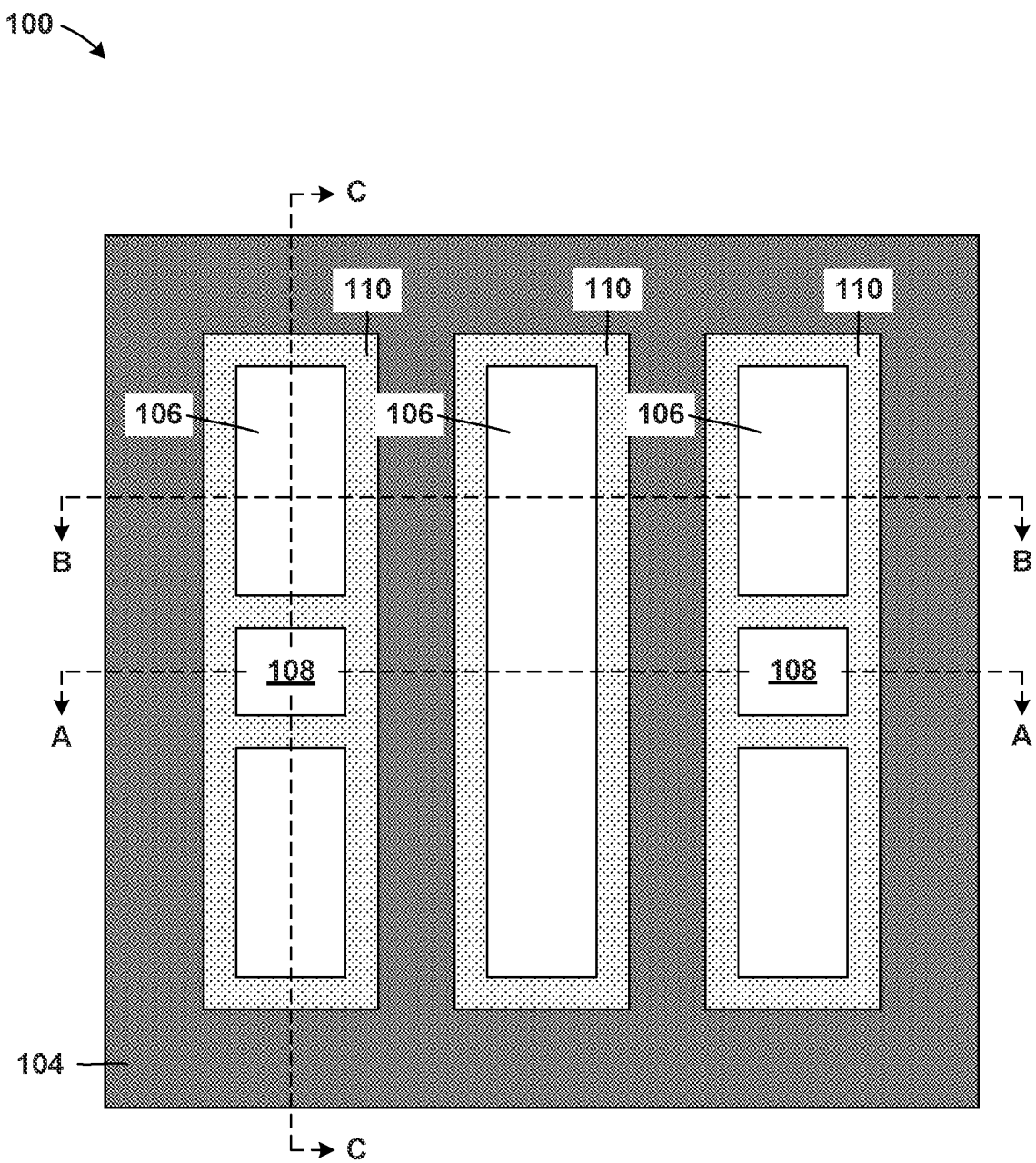
FIGS. 5, 6, 7, and 8, illustrates various views of the semiconductor structure after conformally depositing a dielectric material and subsequently etching that dielectric material to form sidewall spacers according to an exemplary embodiment.
Figure 6:
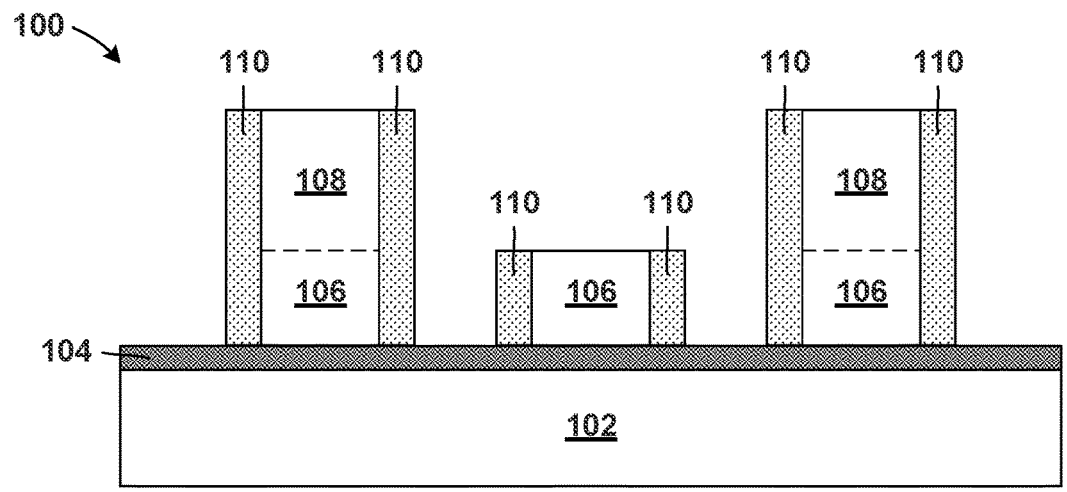
Figure 7:
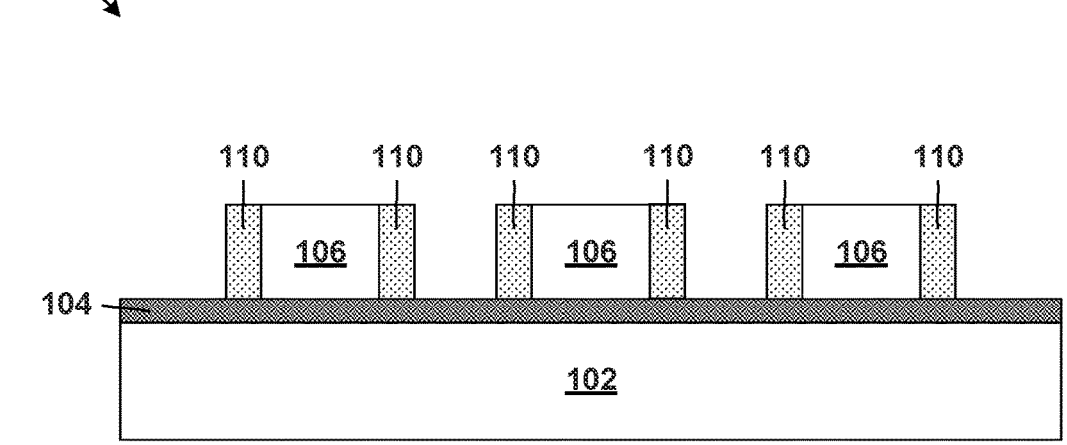
Figure 8:
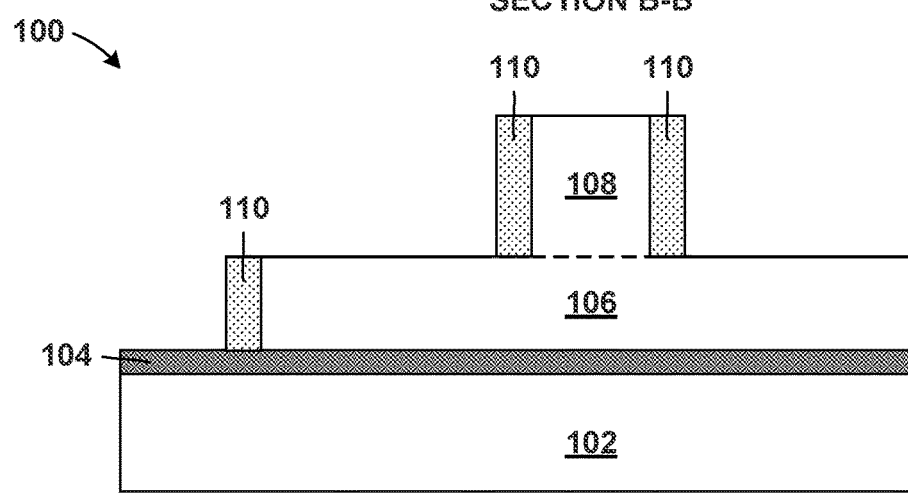

Referring now to FIGS. 5, 6, 7, and 8, the structure 100 is shown after conformally depositing a dielectric material and subsequently etching that dielectric material to form sidewall spacers 110 in accordance with an embodiment of the present invention. FIG. 5 illustrates a top view of the structure 100, FIG. 6 illustrates a cross-section view of the structure 100 along section line A-A, FIG. 7 illustrates a cross-section view of the structure 100 along section line B-B, and FIG. 8 illustrates a cross-section view of the structure 100 along section line C-C.

The sidewall spacers 110 may be formed by conformally depositing or growing a dielectric material, followed by an anisotropic etch that removes the dielectric from the horizontal surfaces of the structure 100 while leaving it on the sidewalls of the metal lines 106 and the top vias 108. In an embodiment, the sidewall spacers 110 may include any suitable dielectric material capable of functioning as a mask, as described in more detail below. In an embodiment, the sidewall spacers 110 may include silicon nitride. In an embodiment, the sidewall spacers 110 may have a horizontal or lateral width, or thickness, ranging from about 2 nm to about 30 nm, with 10 nm being most typical. Typically, the sidewall spacers 110 may include a single layer; however, they may include multiple layers of dielectric material.

Figure 9:
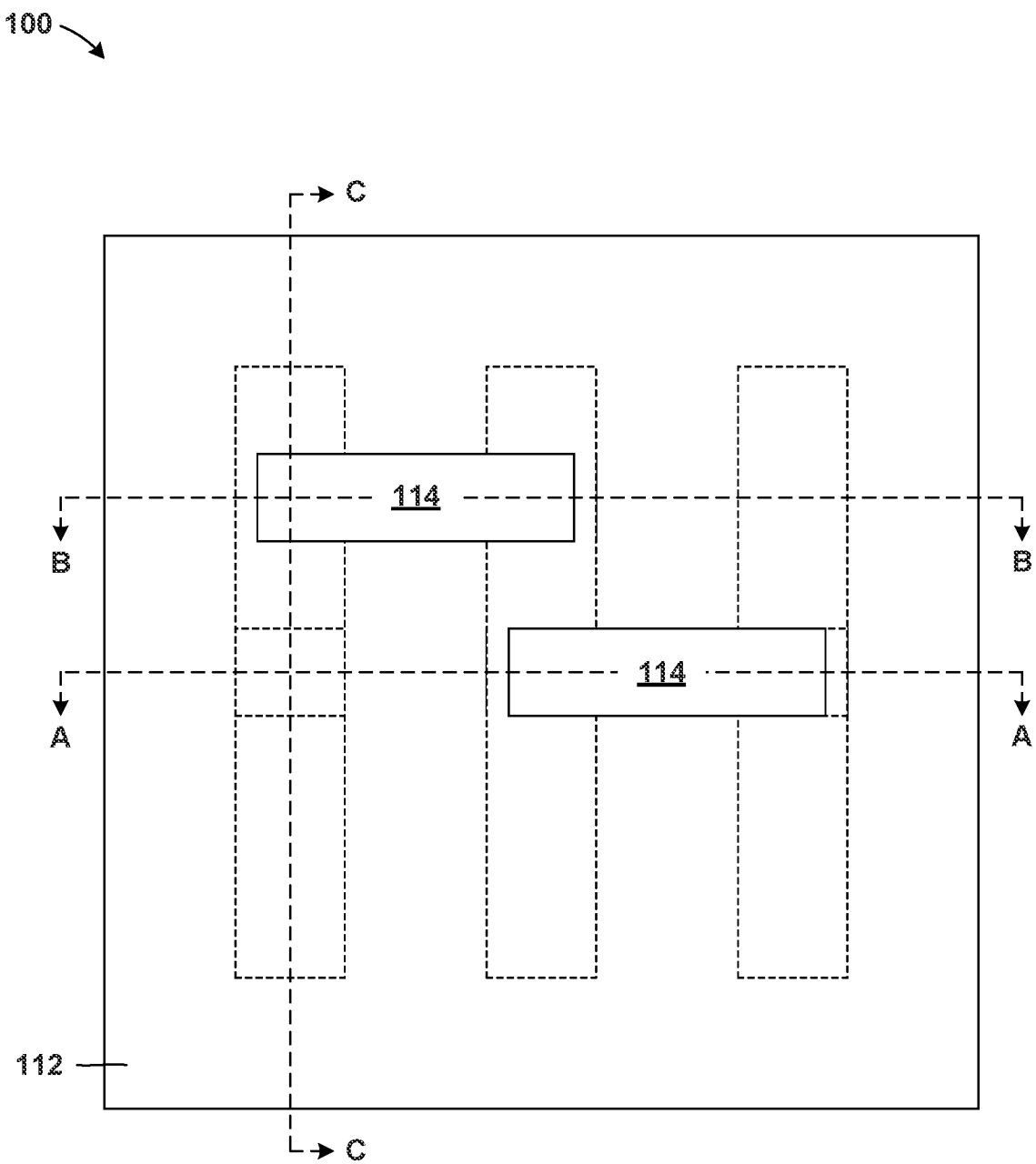
FIGS. 9, 10, 11, and 12, illustrates various views of the semiconductor structure after forming a planarization layer and a hard mask layer according to an exemplary embodiment.
Figure 10:
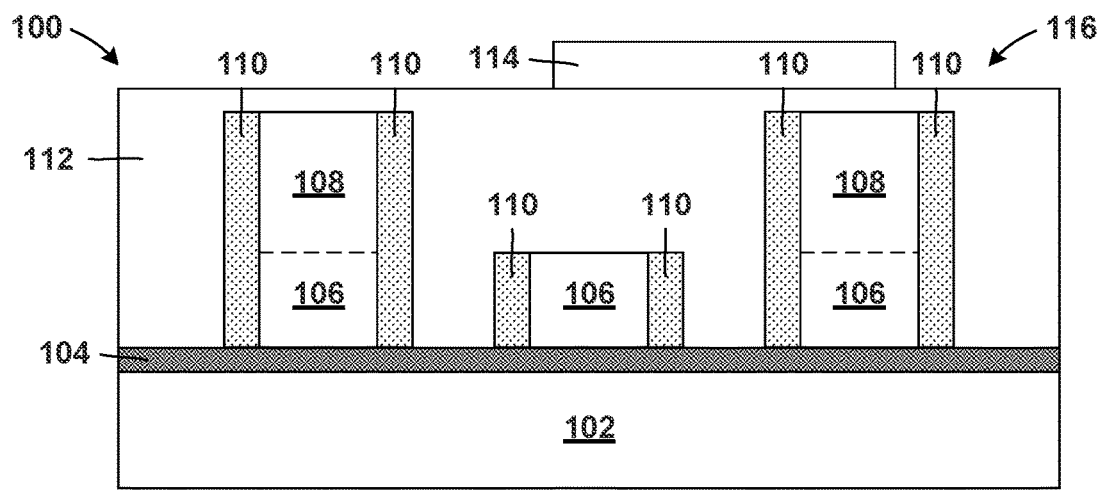
Figure 11:
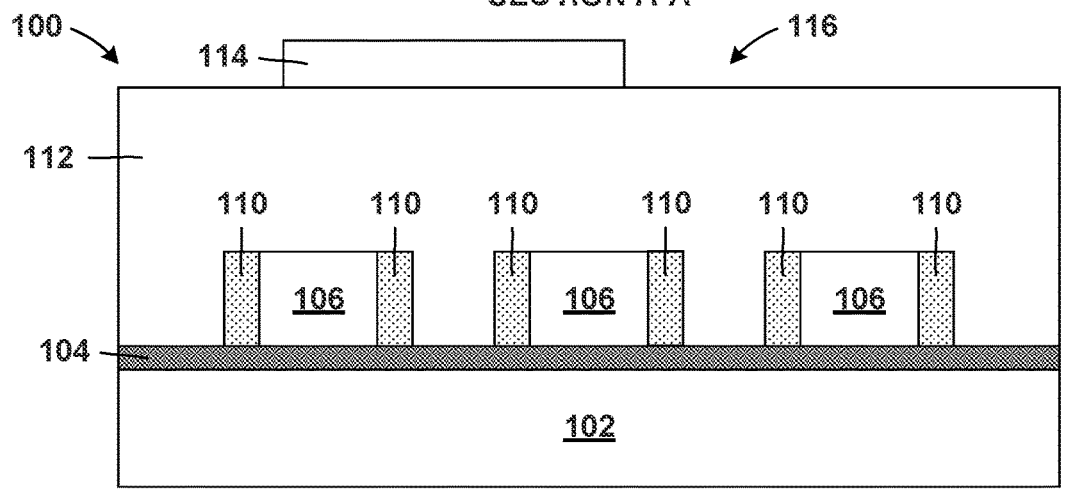
Figure 12:
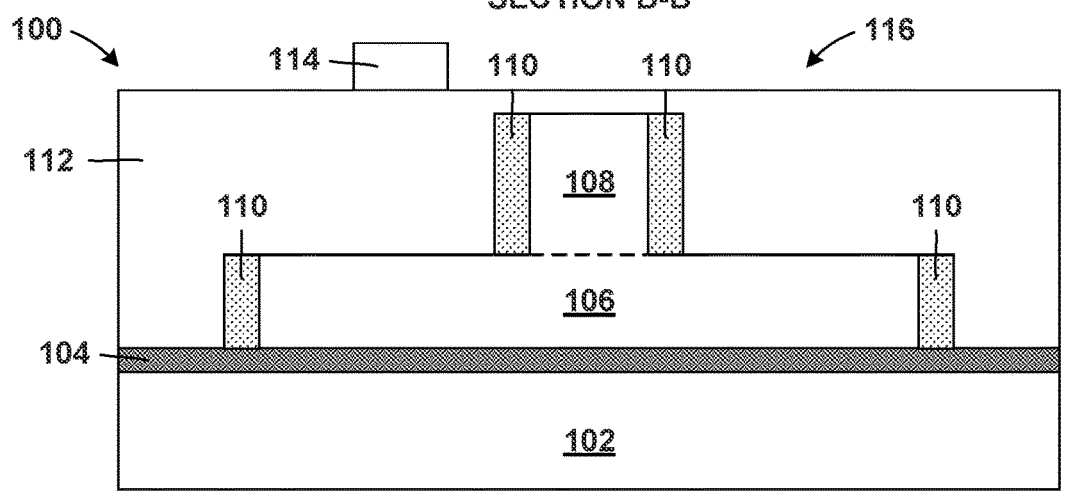

Referring now to FIGS. 9, 10, 11, and 12, the structure 100 is shown after forming a planarization layer 112 and a hard mask layer 114 in accordance with an embodiment of the present invention. FIG. 9 illustrates a top view of the structure 100, FIG. 10 illustrates a cross-section view of the structure 100 along section line A-A, FIG. 11 illustrates a cross-section view of the structure 100 along section line B-B, and FIG. 12 illustrates a cross-section view of the structure 100 along section line C-C.

In doing so, the planarization layer 112 is blanket deposited directly on exposed surfaces of the structure 100. The planarization layer 112 can be an organic planarization layer or a layer of material that is capable of being planarized or etched by known techniques. In an embodiment, for example, the planarization layer 112 can be an amorphous carbon layer able to withstand the high temperatures of subsequent processing steps. The planarization layer 112 can preferably have a thickness sufficient to cover existing structures. For example, the planarization layer 112 would typically be deposited such that is covers both the metal lines 106 and the top vias 108.

Next, the hard mask layer 114 is deposited directly on the planarization layer 112. The hard mask layer 114 is composed of any known dielectric hard mask materials, such as, for example, silicon oxide or silicon nitride. In all cases, the hard mask layer 114 is preferably made from a dielectric material which is capable of being etched or patterned selective to the planarization layer 112 and other surrounding metal features. The hard mask layer 114 can be formed by any deposition technique including, for example, chemical vapor deposition (CVD), plasma enhanced chemical vapor deposition (PECVD), physical vapor deposition (PVD), sputtering, or atomic layer deposition.

Finally, a resist layer (not shown) may be formed on top of the hard mask layer 114 and subsequently patterned with a block mask pattern 116. The block mask pattern 116 may then be transferred into the hard mask layer 114 as illustrated.

Figure 13:
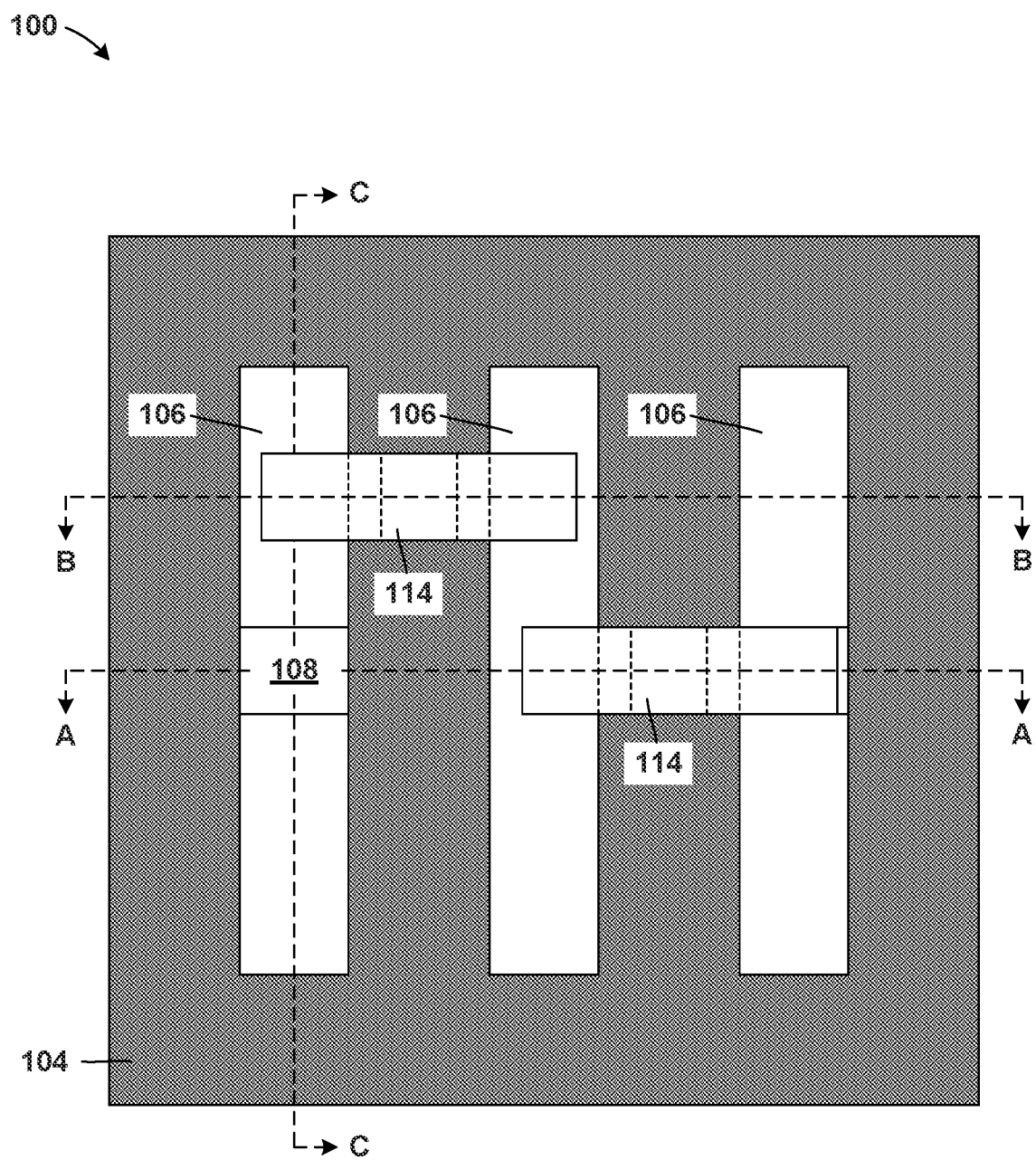
FIGS. 13, 14, 15, and 16, illustrates various views of the semiconductor structure after removing portions of the sidewall spacers according to an exemplary embodiment.
Figure 14:
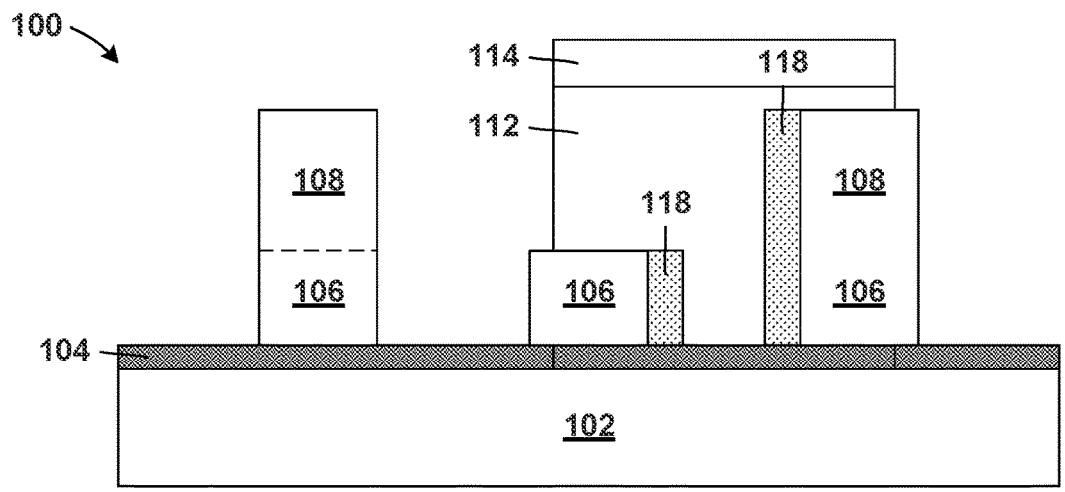
Figure 15:
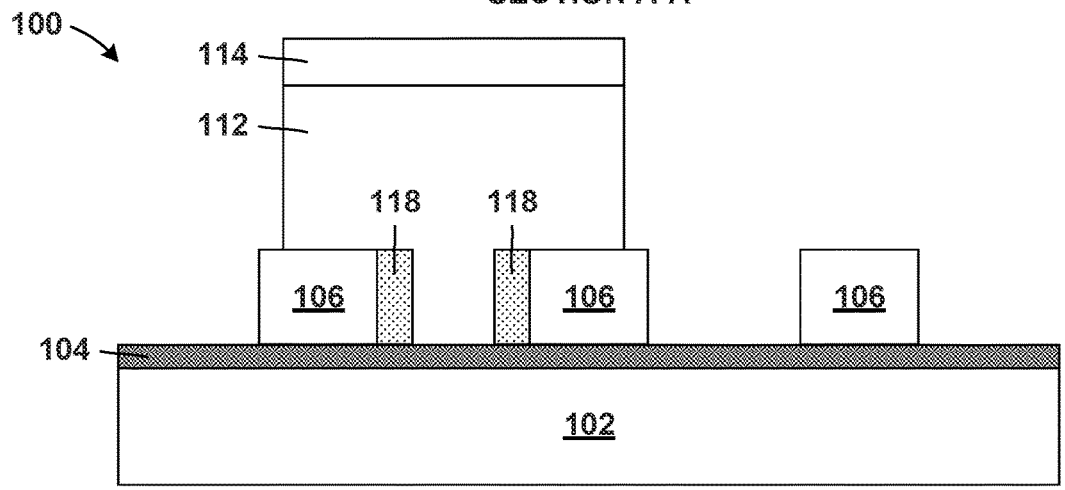
Figure 16:
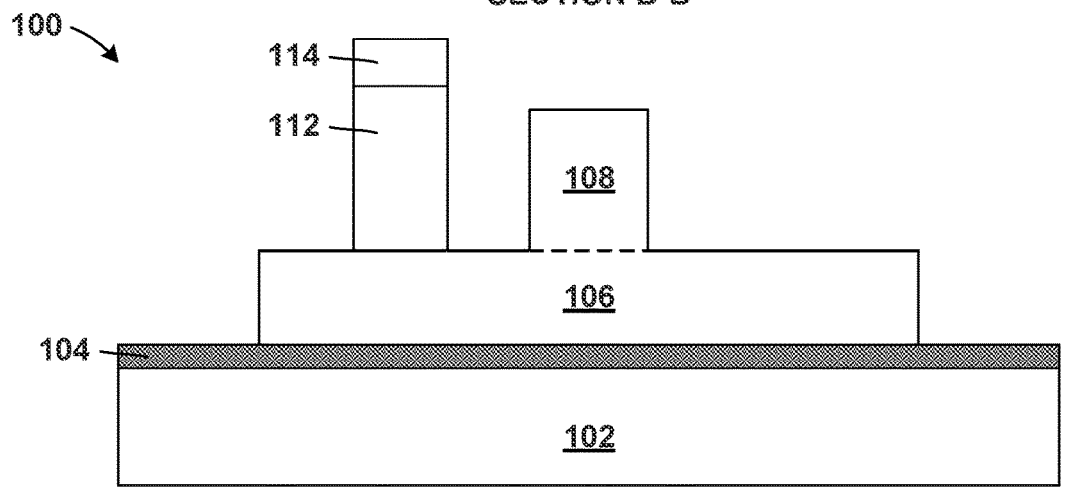

Referring now to FIGS. 13, 14, 15, and 16, the structure 100 is shown after removing portions of the sidewall spacers 110 in accordance with an embodiment of the present invention. FIG. 13 illustrates a top view of the structure 100, FIG. 14 illustrates a cross-section view of the structure 100 along section line A-A, FIG. 15 illustrates a cross-section view of the structure 100 along section line B-B, and FIG. 16 illustrates a cross-section view of the structure 100 along section line C-C.

First, the block mask pattern 116 is transferred into the planarization layer 112, as illustrated. More specifically, one or more suitable etching techniques may be applied to etch exposed portions of the planarization layer 112 otherwise not covered by the hard mask layer 114. Such etching techniques should be designed to remove portions of the planarization layer 112 selective to the etch stop layer 104, the metal lines 106, and the top vias 108. Suitable dry etching techniques may include, but are not limited to: reactive ion etching (RIE), ion beam etching, plasma etching, or laser ablation.

Next, one or more suitable etching techniques may be applied to etch exposed portions of the sidewall spacers 110 otherwise not covered by the planarization layer 112. Such etching techniques should be designed to remove portions of the sidewall spacers 110 selective to the planarization layer 112, the etch stop layer 104, the metal lines 106, and the top vias 108. Suitable dry etching techniques may include, but are not limited to: reactive ion etching (RIE), ion beam etching, plasma etching, or laser ablation. After which, portions of the sidewall spacers 110 remain beneath the planarization layer 112, which are herein referred to as remaining sidewall spacers 118, as illustrated.

Location of the remaining sidewall spacers 118 is critical to the invention. Specifically, the block mask pattern 116 and resulting location of the remaining sidewall spacers 118 is specifically chosen based on the desired function of the antifuse structures disclosed herein, and described in more detail below. As illustrated, the remaining sidewall spacers 118 are provided in two exemplary locations, one offset from the top via 108 shown on the left and another aligned with the top via 108 on the right. Both locations are provided for illustrative purposes only, and any resulting structure may include the remaining sidewall spacers 118 in only one of the two locations shown in the figures. Furthermore, in all embodiments, the block mask pattern 116 is specifically designed to produce remaining sidewall spacers 118 in pairs on opposing or adjacent metal lines or conductors, such as the metal lines 106. Therefore, remaining sidewall spacers 118 on opposite sides of the same conductor alone is not contemplated to produce the intended resulting structure.

Figure 17:
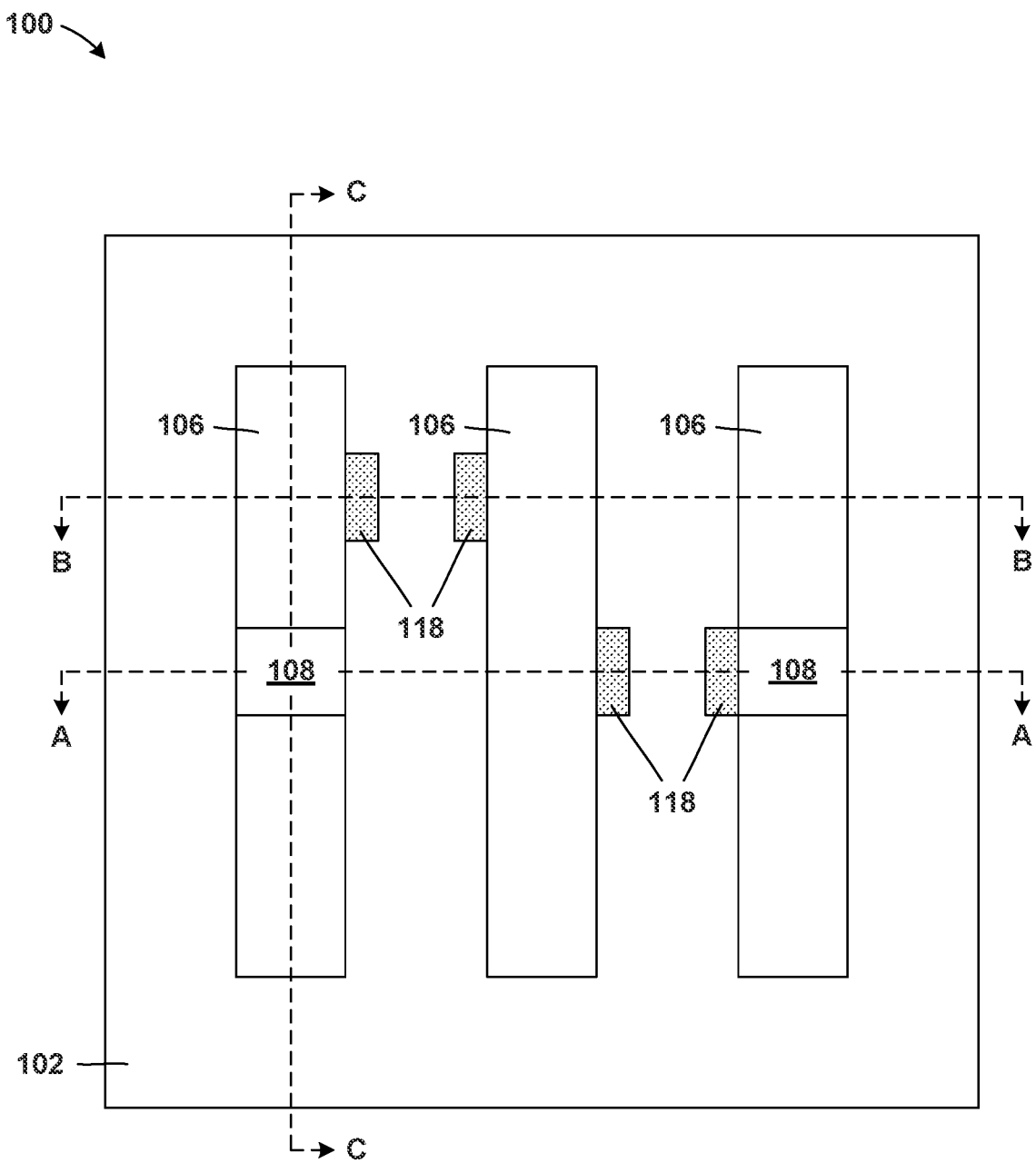
FIGS. 17, 18, 19, and 20, illustrates various views of the semiconductor structure after removing the planarization layer and the hard mask layer followed by patterning the etch stop layer according to an exemplary embodiment.
Figure 18:
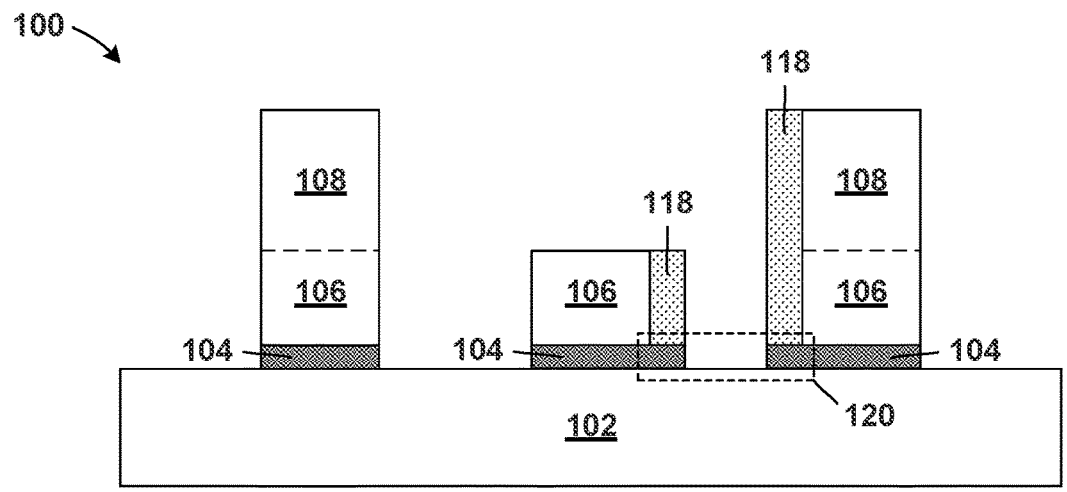
Figure 19:
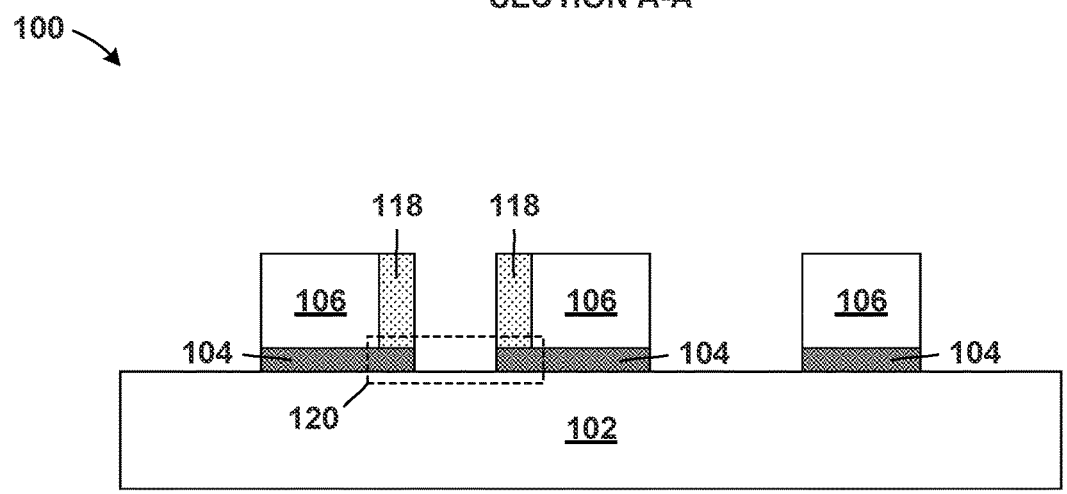
Figure 20:
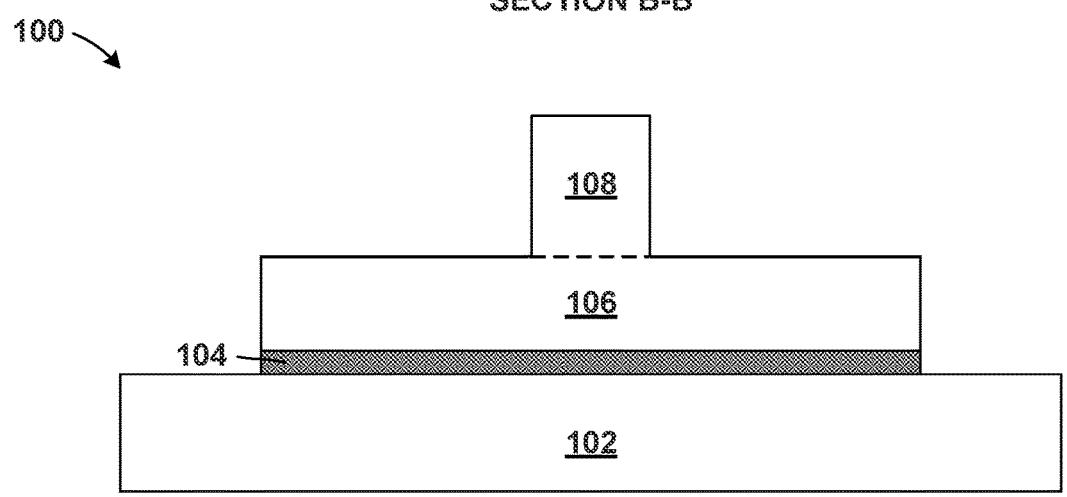

Referring now to FIGS. 17, 18, 19, and 20, the structure 100 is shown after removing the planarization layer 112 and the hard mask layer 114 followed by patterning the etch stop layer 104 in accordance with an embodiment of the present invention. FIG. 17 illustrates a top view of the structure 100, FIG. 18 illustrates a cross-section view of the structure 100 along section line A-A, FIG. 19 illustrates a cross-section view of the structure 100 along section line B-B, and FIG. 20 illustrates a cross-section view of the structure 100 along section line C-C.

First, the planarization layer 112 and the hard mask layer 114 are removed selective to all underlying structure according to known techniques. For example, in at least one embodiment, the hard mask layer 114 is removed using a wet etching technique and the planarization layer 112 is removed by ashing.

Next, the etch stop layer 104 is patterned selective to the remaining sidewall spacers 118, the top vias 108, and the metal lines 106. Stated differently the etch stop layer 104 is removed everywhere except directly beneath the remaining sidewall spacers 118, as illustrated. After which, portions of the etch stop layer 104 extending laterally from beneath the metal lines 106 remain, which are herein referred to as extension regions 120, as illustrated.

One or more suitable etching techniques may be applied to etch exposed portions of the etch stop layer 104 otherwise not covered by the remaining sidewall spacers 118. Such etching techniques should be designed to remove portions of the etch stop layer 104 selective to the remaining sidewall spacers 118, the metal lines 106, the top vias 108, and the underlying level 102. Suitable dry etching techniques may include, but are not limited to: reactive ion etching (RIE), ion beam etching, plasma etching, or laser ablation.

Figure 21:
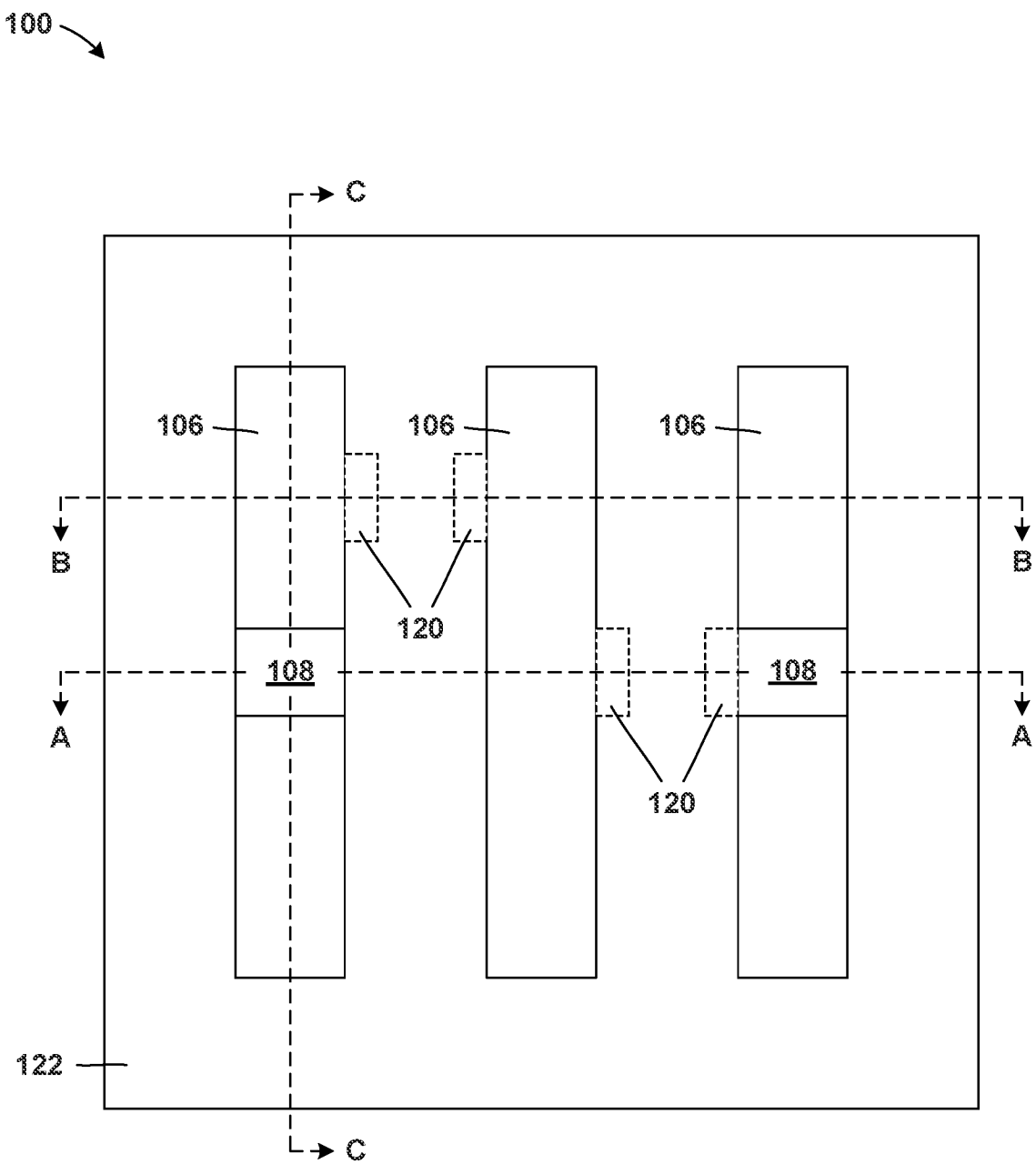
FIGS. 21, 22, 23, and 24, illustrates various views of the semiconductor structure after forming an interlevel dielectric layer according to an exemplary embodiment.
Figure 22:
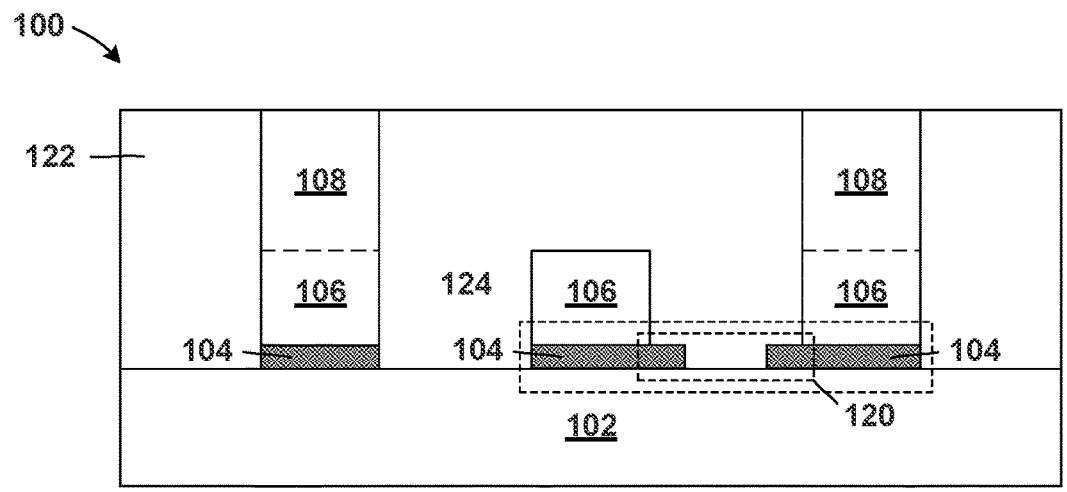
Figure 23:
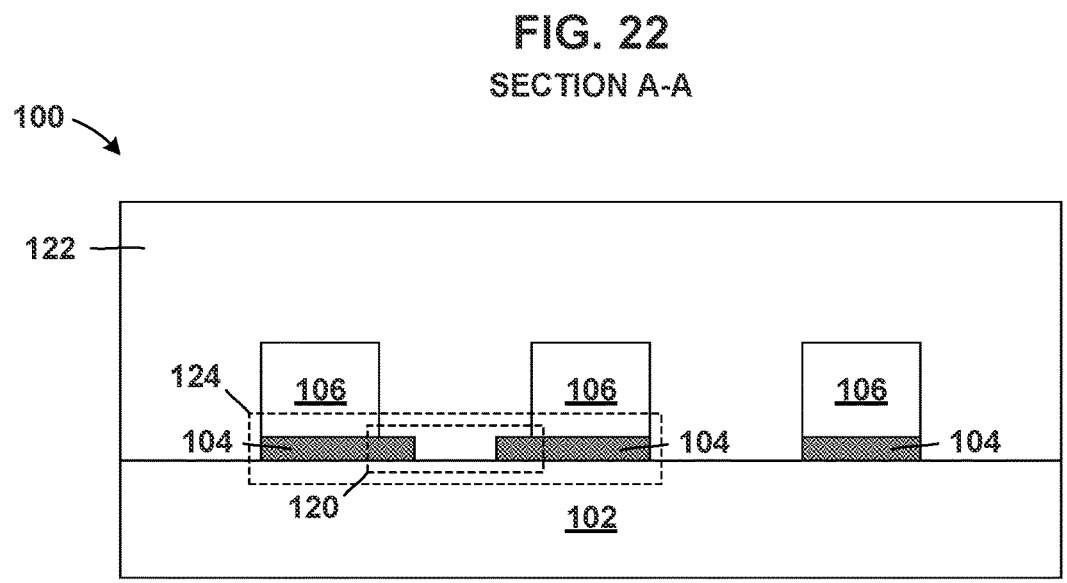
Figure 24:
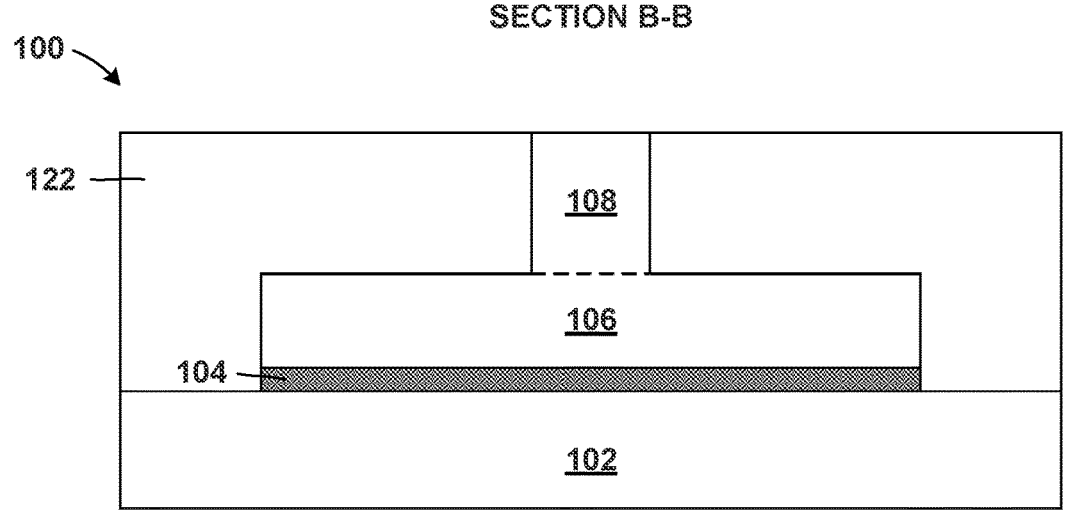

Referring now to FIGS. 21, 22, 23, and 24, the structure 100 is shown after forming an interlevel dielectric layer 122 in accordance with an embodiment of the present invention. FIG. 21 illustrates a top view of the structure 100, FIG. 22 illustrates a cross-section view of the structure 100 along section line A-A, FIG. 23 illustrates a cross-section view of the structure 100 along section line B-B, and FIG. 24 illustrates a cross-section view of the structure 100 along section line C-C.

The interlevel dielectric layer 122 may be composed of, for example, silicon oxide ($SiO_x$), undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. As indicated above, the term "low-κ" as used herein refers to a material having a relative dielectric constant κ which is lower than that of silicon dioxide.

In an embodiment, the interlevel dielectric layer 122 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. After deposition, a planarization technique such as, for example, chemical mechanical planarization (CMP) and/or grinding is applied. The planarization technique removes excess material of the interlevel dielectric layer 122 and continues polishing until the uppermost surfaces of the top vias 108 are exposed. After polishing the uppermost surfaces of the top vias 108 are flush, or substantially flush, with an uppermost surface of the interlevel dielectric layer 122. In another embodiment, interlevel dielectric layer 122 may include a self-planarizing material such as a spin-on glass (SOG) or a spin-on low-κ dielectric material such as SiLK™. Doing so may avoid the need to perform a subsequent planarizing step.

The extension regions 120 functionally decrease the distance between two adjacent metal lines, and form the basis of embedded antifuse structures 124. The extension regions 120 of each antifuse structures 124 are generally aligned with and opposite each other; however, other configurations are explicitly contemplated herein. For example, the extensions regions 120 of a single antifuse structure may be laterally offset from one another while maintaining the desired antifuse function.

Again, one antifuse structure 124 shown on the left is offset from the top via 108 and the other antifuse structure 124 shown on the right is aligned with the top via 108. Both antifuse structures 124 are provided for illustrative purposes only, and any resulting structure may include only one of the antifuse structures 124. In an alternative embodiment, the structure 100 includes more than two antifuse structures 124 in either configuration. Finally, the antifuse structures 124 illustrated in FIGS. 21-24 are shown before programming.

The antifuse structures 124 disclosed herein are particularly beneficial because the extension regions 120 can be easily integrated into narrow-pitch interconnect designs; the extension regions 120 takes up minimal space, compared to traditional antifuse configurations; and the embedded antifuse is compatible with top via interconnect configurations due to the existence of the etch stop layer 104.

Figure 25:
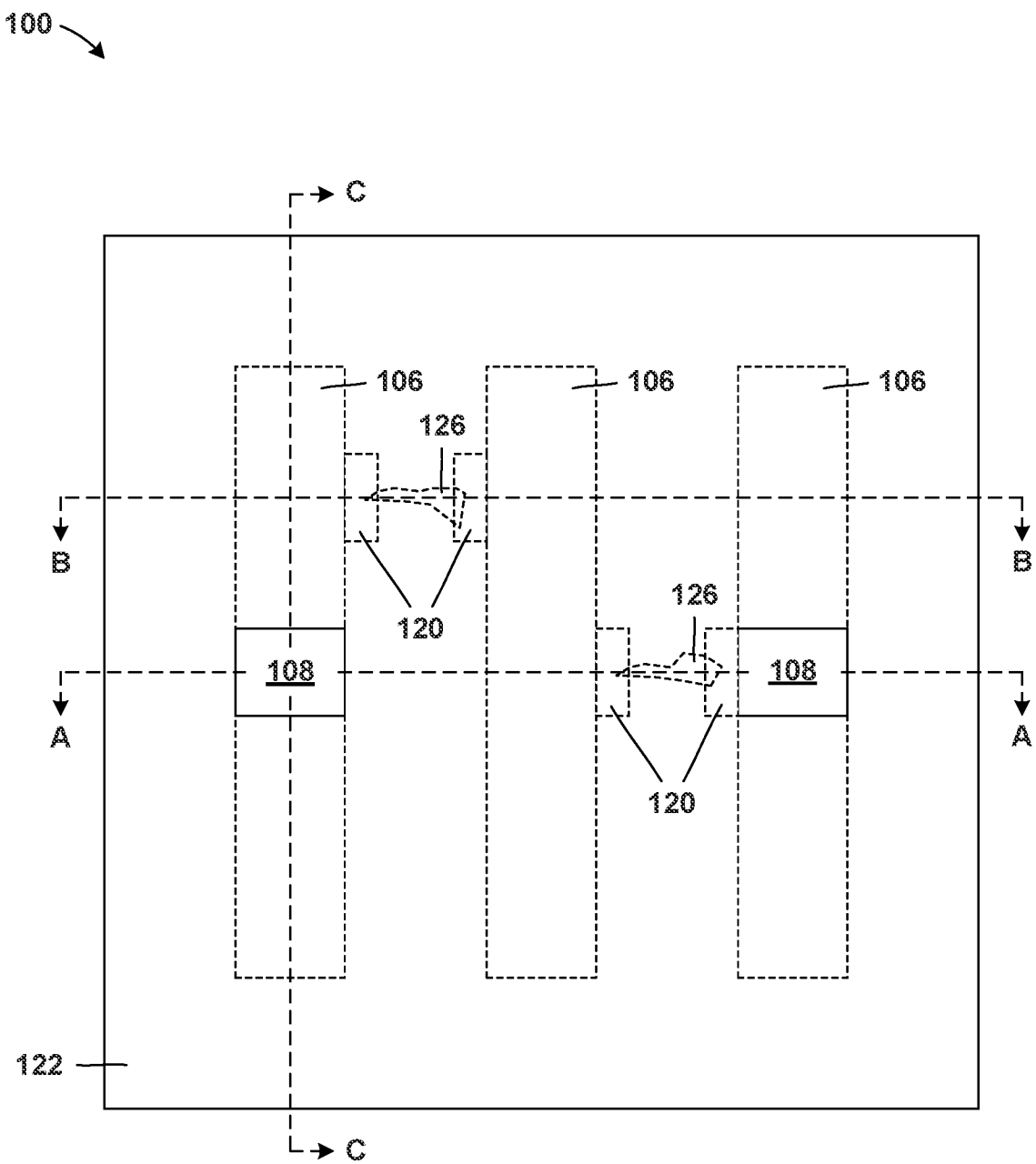
FIGS. 25, 26, and 27, illustrates various views of the semiconductor structure after programming the antifuse structures according to an exemplary embodiment.
Figure 26:
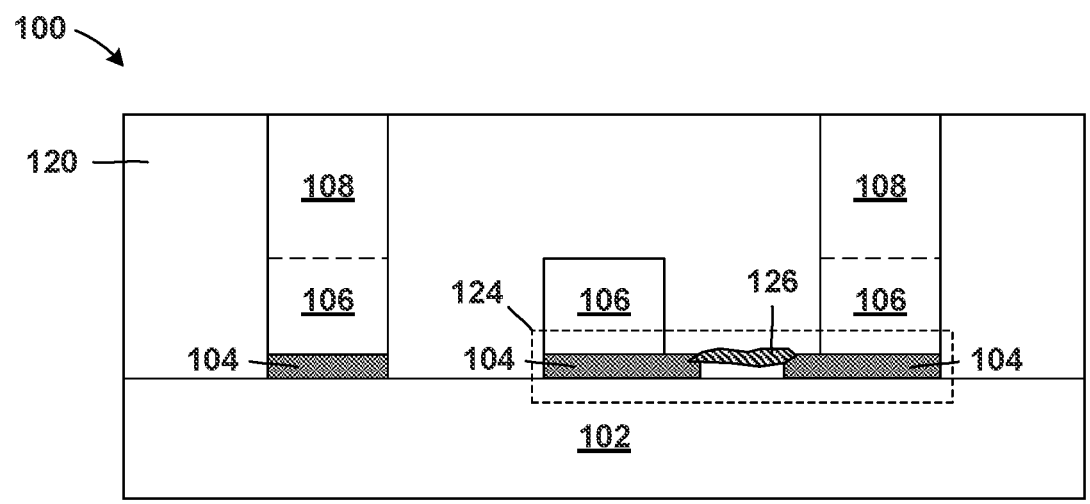
Figure 27:
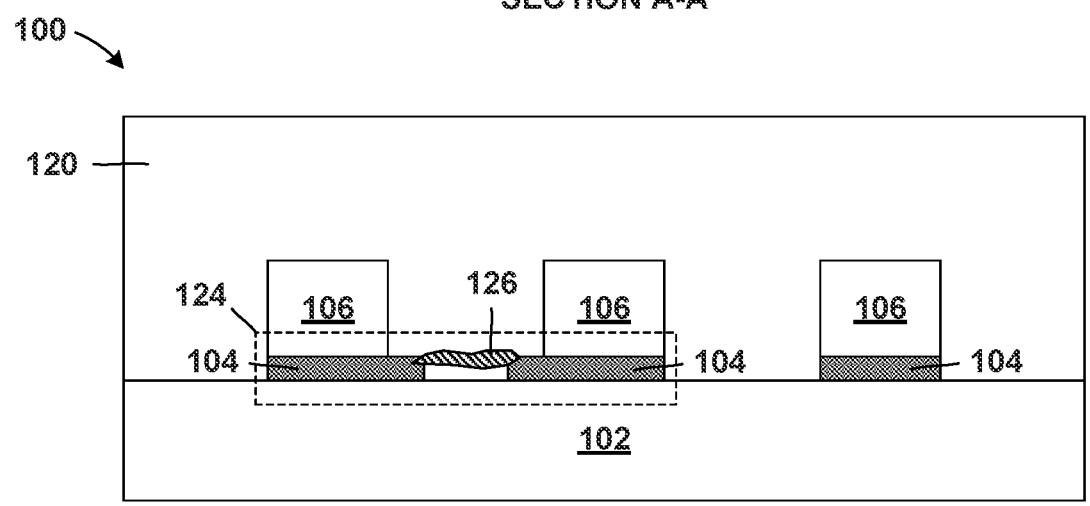

Referring now to FIGS. 25, 26, and 27, the structure 100 is shown after programming the antifuse structures 124 in accordance with an embodiment of the present invention. FIG. 25 illustrates a top view of the structure 100, FIG. 26 illustrates a cross-section view of the structure 100 along section line A-A, and FIG. 27 illustrates a cross-section view of the structure 100 along section line B-B.

The extension regions 120 create a "weak point" prone to electromigration. More specifically, electromigration during fuse programing creates a conductive link 126 between the extension regions 120 The antifuse structures 124 can be programmed by applying a programming voltage to one of the metal lines 106 and grounding the other. In the context of the present invention, either the programming voltage or the ground may alternatively be applied to the top via 108. Persons having ordinary skill in the art understand the structure 100 disclosed herein will be part of a larger integrated circuit and include additional metal layers, wiring, traces, vias which may also be involved in programming.

The programming voltage may range from about 1 V to about 10 V, and have a current ranging from about 2 mA to about 10 mA. As a result, the conductive material of one of the extension regions 120 will migrate, or jump, to the opposing extension regions 120 through the interlevel dielectric layer 122, as illustrated. Such migration of conductive material from the one extension regions 120 forms the conductive link 126 between opposing extension regions 120, and thereby forms an electrical connection between the two adjacent metal lines 106.

The conductive link 126 may have a thickness ranging from about 1 nm to about 10 nm and ranges there between. The length of the conductive link 126 is equal to the breakdown distance of each anti-fuse structure 124. In the present embodiments, the breakdown spacing, or distance between opposite extension regions 120, is inversely proportional to the conformal or lateral thickness of the sidewall spacers 110. Therefore, as the lateral thickness of the sidewall spacers 110 increases, the distance between opposite extension regions 120 decreases. Adjusting the breakdown spacing will affect how much programming current is required and how long it takes to program or form the conductive link 126.

With continued reference to FIGS. 25-27, in at least one example, the breakdown distance is about 50% of the distance between two adjacent metal lines 106; however, programing is not solely dependent on the breakdown distance. The thickness of the extension regions 120 (the etch stop layer 104) will also affect programing. Preferably, the breakdown distance may be such to yield a programming current of about 5 mA.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An antifuse structure comprising:
   a first metal line comprising a length greater than a uniform width;
   a top via above and directly contacting the first metal line;
   a second metal line parallel to the first metal line and comprising a length greater than a uniform width; and
   a conductive etch stop layer separating both the first metal line and the second metal line from an underlying layer, wherein a thickness of the conductive etch stop layer is less than a thickness of each of the first metal line and the second metal line, wherein a first portion of the conductive etch stop layer directly beneath the first metal line comprises a first extension region and a second portion of the conductive etch stop layer directly beneath the second metal line comprises a second extension region opposite the first extension region, and wherein the first portion of the conductive etch stop layer is completely separated from the second portion of the conductive etch stop layer by an interlevel dielectric layer.

2. The antifuse structure according to claim 1, wherein a distance between the first extension region and the second extension region is approximately 50 percent of a distance between the first metal line and the second metal line.

3. The antifuse structure according to claim 1, wherein the first metal line and the second metal line are directly on top of and cover completely the conductive etch stop layer except for the first extension region and the second extension region such that top surfaces of the first extension region and the second extension region directly contact an interlevel dielectric layer.

4. The antifuse structure according to claim 1, wherein the first extension region extends perpendicular to the length of the first metal line in a direction towards the second metal line and the second extension region extends perpendicular to the length of the second metal line in a direction towards the first metal line.

5. The antifuse structure according to claim 1, wherein the first extension region and the second extension region are aligned with the top via in a direction parallel to the length of the first metal line.

6. The antifuse structure according to claim 1, wherein the first extension region and the second extension region are laterally offset from the top via in a direction parallel to the length of the first metal line.

7. An antifuse structure comprising: a first metal line; a top via above and directly contacting the first metal line, wherein the first metal line and the top via consist of a homogenous conductive material without an interface, wherein a width of the top via is substantially equal to a width of the first metal line; a second metal line adjacent and parallel to the first metal line; and a conductive etch stop layer separating both the first metal line and the second metal line from an underlying layer, wherein a first portion of the conductive etch stop layer directly beneath the first metal line comprises a first extension region and a second portion of the conductive etch stop layer directly beneath the second metal line comprises a second extension region opposite the first extension region.

8. The antifuse structure according to claim 7, wherein a distance between the first extension region and the second extension region is less than a distance between the first metal line and the second metal line.

9. The antifuse structure according to claim 7, wherein the first metal line and the second metal line are directly on top of and cover completely the conductive etch stop layer except for the first extension region and the second extension region such that top surfaces of the first extension region and the second extension region directly contact an interlevel dielectric layer.

10. The antifuse structure according to claim 7, wherein the first extension region extends perpendicular to a length of the first metal line in a direction towards the second metal line and the second extension region extends perpendicular to a length of the second metal line in a direction towards the first metal line.

11. The antifuse structure according to claim 7, wherein the first extension region and the second extension region are aligned with the top via in a direction parallel to a length of the first metal line.

12. The antifuse structure according to claim 7, wherein the first extension region and the second extension region are laterally offset from the top via in a direction parallel to a length of the first metal line.

13. An antifuse structure comprising: a first conductive etch stop layer comprising a first extension region; a first metal line directly on top of and completely covering all of the first conductive etch stop layer except for the first extension region such that a top surface of the first extension region directly contacts an interlevel dielectric layer; a top via above and directly contacting the first metal line, wherein a width of the top via is substantially equal to a width of the first metal line; a second conductive etch stop layer comprising a second extension region aligned with the first extension region; and a second metal line directly on top of and completely covering all of the second conductive etch stop layer except for the second extension region such that a top surface of the second extension region directly contacts the interlevel dielectric layer.

14. The antifuse structure according to claim 13, wherein the first metal line and the top via consist of a homogenous conductive material.

15. The antifuse structure according to claim 13, wherein the first extension region extends in a direction towards the second metal line and the second extension region extends in a direction towards the first metal line.

16. The antifuse structure according to claim 13, wherein the first extension region and the second extension region are aligned with the top via.

17. The antifuse structure according to claim 13, wherein the first extension region and the second extension region are laterally offset from the top via.

* * * * *